United States Patent [19]

Forester

[11] Patent Number: 4,469,536
[45] Date of Patent: Sep. 4, 1984

[54] ALLOYS AND METHOD OF MAKING

[75] Inventor: Donald W. Forester, Springfield, Va.

[73] Assignee: The United States of America as represented by the Secretary of the Navy, Washington, D.C.

[21] Appl. No.: 440,687

[22] Filed: Nov. 10, 1982

[51] Int. Cl.³ .............................................. C22C 19/00
[52] U.S. Cl. ................................... 148/403; 420/435; 420/441; 420/459; 75/123 R; 75/123 F; 75/123 K; 75/126 R; 75/126 H; 75/128 R; 75/128 B; 75/128 P; 428/900; 428/611; 428/433
[58] Field of Search .......... 148/403; 75/123 R, 123 F, 75/123 K, 125, 126 H, 126 P, 126 R, 128 R, 128 B, 128 F, 128 P; 428/606, 607, 611, 432, 433, 900; 420/435, 441, 459

[56] References Cited

U.S. PATENT DOCUMENTS

| | | |
|---|---|---|
| 3,126,345 | 3/1964 | Swoboda . |
| 3,126,346 | 3/1964 | Bither . |
| 3,144,324 | 8/1964 | Bither . |
| 3,664,865 | 5/1972 | Lanza . |
| 3,762,915 | 10/1973 | Heine et al. . |
| 3,856,513 | 12/1974 | Chen et al. ........................ 75/128 R |
| 3,940,293 | 2/1976 | Polk et al. ........................... 148/403 |
| 4,014,688 | 3/1977 | Schreiner et al. . |
| 4,118,222 | 10/1978 | Tanner ................................ 148/403 |
| 4,133,682 | 1/1979 | Ray ..................................... 148/403 |
| 4,172,718 | 10/1979 | Menzel ................................ 148/403 |
| 4,182,628 | 1/1980 | D'Silva ............................... 148/403 |
| 4,247,326 | 1/1981 | Quinto et al. . |
| 4,255,187 | 3/1981 | Bhattcharya et al. . |
| 4,255,188 | 3/1981 | Rickels . |

FOREIGN PATENT DOCUMENTS 56-105452  8/1981  Japan ................................. 148/403

OTHER PUBLICATIONS

Forester et al., J. App. Phys. 53(3), 1982.
27th Annual Conference on Magnetism and Magnetic Materials, A New Magnetic Amorphous Allow System: Iron-Bismuth, D. W. Forester et al., given on Nov. 10-13, 1981.
27th Annual Conference on Magnetism and Magnetic Materials, Preparation and Properties of Coevaporated Amorphous Co-Zr Thin Films, Krishnan et al., given on Nov. 10-13, 1981.
Mader, S., "Metastable Alloy Films," *J. Vacuum Sci. Technol.*, 2 35-41, (1965).
*Handbook of Thin Film Technology*, Ed. Maissel et al., McGraw-Hill Book Co., New York, pp. 1-85 – 1-91, (1970).

Primary Examiner—John P. Sheehan
Attorney, Agent, or Firm—Robert F. Beers; William T. Ellis; Barry A. Edelberg

[57] ABSTRACT

Novel alloys composed of two immiscible metals are made by vapor-depositing the metals simultaneously onto a suitable substrate. By way of example, alloys of iron and bismuth or cobalt and bismuth may be produced according to this invention. Many of the novel alloys have useful ferromagnetic and magneto-optical properties.

11 Claims, 5 Drawing Figures

4,469,536

ALLOYS AND METHOD OF MAKING

BACKGROUND OF THE INVENTION

This invention relates generally to metallic alloys, and more particularly to a new class of amorphous metallic alloys.

Until now it has not been believed possible to obtain an alloy where one metal is immiscible in the other metal. Such an alloy, if it could be obtained, would present several advantages. Totally new alloy systems would become available. Since one of the metals of the alloy is immiscible in the other, it may be assumed that there is minimal interaction between the atoms of the immiscible metals. Hence, one could dilute a metal with a second metal which is immiscible in the first metal without significantly altering the atomic properties of either metal. For example, bismuth could be added to iron or cobalt to improve the switching characteristics of the iron or cobalt, without significantly reducing the atomic magnetic moments of iron or cobalt.

Currently, there are no known intermetallic compounds, eutectic alloys, or solid solutions of any type incorporating iron or cobalt and bismuth. Bismuth is almost totally insoluble in iron or cobalt and its melting point (544 K.) is less than one third that of iron (1768 K.).

U.S. Pat No. 4,014,688 to Schreiner et al. discloses an alloy composed of a eutectic mixture of iron crystals in boron, the mixture having a small amount (about 0.3 weight percent) of precipitated bismuth being finely dispensed at the boundaries of the iron crystals. In U.S. Pat. No. 3,762,915 to Heine et al., an extremely small amount of bismuth (about 0.0005 to 0.02 weight percent) is added to a gray casting iron composition in order to alter the freezing characteristics of the composition. Neither of these alloys, however, are true alloys of bismuth. Instead, extremely small amounts of bismuth exist as precipitates throughout the alloy. The relatively low freezing point of bismuth as opposed to that of iron exaggerates the tendency of bismuth to segregate from iron or steel while the mixture solidifies. Of course, a similar difficulty occurs when one attempts to alloy cobalt or nickel with bismuth and when one attempts to alloy immiscible metals in general. In contrast to these prior iron or steel-bismuth compositions, novel Fe-Bi alloys of this invention are about fifty percent bismuth by volume (about 40-50 weight-percent bismuth). In this description, the notations (Fe,Co)-Bi, (Fe,Co)-bismuth and $(Fe,Co)_{1-x}Bi_x$ refer to alloys of iron and bismuth and alloys of cobalt and bismuth. Notations such as Fe-Bi and Mn-Bi are merely shorthand for the more formal notations employing subscripts.

The desirability of an amorphous iron, cobalt, or nickel-bismuth alloy derives from the alloys' unique ferromagnetic and magneto-optical properties. Often, data is stored in memory by magnetically recording data on reflective ferromagnetic film. The film is read by directing a polarized laser beam onto the surface of the film. The magnetic domains in the region where the light strikes rotate the plane of polarization of the light reflected from the film and causes it to differ from that of the incident beam. This change or rotation of the plane of polarization is referred to as the Kerr rotation. The extent of the Kerr rotation observed depends on the composition of the ferromagnetic film and the wavelength of the incident light. By selecting the appropriate combination of ferromagnetic material for the film and wavelength of incident light, one can determine the configuration of the magnetic domains in the film and recover the information recorded thereon. Of course, one can also recover information from the film by conventional playback means as well.

From the standpoint of practical applications, Mn-Bi crystalline alloys are known to have the highest magneto-optical Kerr rotations of any alloy system to date and are frequently used in magneto-optical mirrors and magnetic-optic memory applications. Since the Kerr rotation in general is larger for larger magnetization alloys of the transition elements, it could be expected that in some wavelength regions, Fe-Bi and Co-Bi should outperform crystalline Mn-Bi because iron and cobalt have much larger magnetic moments than manganese.

For magnetic storage of data, it is desirable that the switching characteristics of the film should be as square as possible. That is, the film should have as few pinning defects as possible so that the walls of the magnetic domains within the film can expand freely in response to an external magnetic field. Of course, the magnetic domains must be capable of aligning in the magnetic field used for magnetic recording and yet not be so responsive that stray magnetic fields cause them to lose their alignment.

Further, it is desirable that a recording film be able to store as much data as possible in as small a space as possible. When, as is typical, the magnetic domains of the magnetic recording film are oriented parallel to the film surface, each domain exerts some influence upon its neighboring domains. Therefore, when recording upon magnetic film, care must be taken so that the magnetic domains along the film are not overly crowded. Thus, the amount of data that can be stored within any one area of film becomes severely limited. On the other hand, if the magnetic domains are oriented perpendicular to the film surface, the problem of domains interacting with neighboring domains is greatly allieviated. Therefore, more data can be stored on a film which has its domains oriented perpendicular to the film surface than on a film which has its domains oriented parallel to the film surface. Previously, a film having a large net magnetization and its domains oriented perpendicular to the film surface was quite difficult to obtain.

While elemental iron and cobalt are strongly ferromagnetic and exhibit large Kerr rotations, films of elemental iron or cobalt have relatively poor switching and memory storage characteristics. Alloys, frequently crystalline, of iron or cobalt with other elements have been used to attempt to overcome these difficulties. Most recently, films of transition metal-metalloid metallic glasses, such as Fe-B, have been used for magneto-optical applications. These glasses, however, generally have magnetic domains oriented in the film plane, reduced magnetization of the transition metal atoms, and strong tendencies toward oxidation. Therefore, the handling of these glasses is a difficult and delicate matter.

Although, the alloys of this invention are amorphous, they differ significantly from metallic glasses, such as $Fe_{1-x}B_x$. While the novel alloys are, like metallic glasses, most stable near the x=0.2 region, unlike metallic glasses, the novel alloys have no crystalline phase diagrams. Further, the novel alloys of this invention have a majority of metallic atoms with radii that are significantly smaller than the radii of the minority of the atoms in the metastable alloy, in contrast to the metallic glasses.

Although amorphous alloys of $Mn_{0.8}Bi_{0.2}$ have been made using a process similar to that used to produce the novel alloys of this invention, the constituent elements of $Mn_{0.8}Bi_{0.2}$, manganese and bismuth, are miscible, unlike the constituent metals of alloys of this invention. Therefore, the existence of an amorphous alloy of manganese and bismuth would not cause one to suspect that an amorphous alloy of two immiscible metals could be obtained. Further, amorphous $Mn_{0.8}Bi_{0.2}$ has no magnetic moment down to 78 K., while several of the alloys of this invention, for example $Fe_{0.86}Bi_{0.14}$, are usefully ferromagnetic even at room temperature and above.

OBJECTS OF THE INVENTION

An object of this invention is to provide useful and novel alloys of certain immiscible metals.

Another object of this invention is to provide a novel process for alloying certain immiscible metals.

A further object of this invention is to provide an alloy having a sufficient Kerr rotation to be used as a magneto-optical mirror.

Still another object of this invention is improve the switching characteristics of elemental iron without significantly altering the magnetic moment per iron atom.

Yet another object of this invention is to provide a ferromagnetic alloy which is stable over a wide range of temperatures and resistant to oxidation under most conditions.

A still further object of this invention is to provide a ferromagnetic alloy film having magnetic domains oriented perpendicular to the film surface while maintaining a large net magnetic moment.

SUMMARY OF THE INVENTION

These and other objects are achieved by vapor-depositing two immiscible metals, one metal being composed essentially of atoms that have about 1.2-2.5 times as large an atomic radius as the atoms of the other, onto a suitable substrates to that the condensate contains about 10-14 atomic percent of the metal with the larger atoms. When the metals condense upon a suitable substrate, they are both evenly distributed. The rapid quenching of the metals prevents their segregation and inhibits crystal formation, allowing a metastable amorphous alloy to form.

BRIEF DESCRIPTION OF THE DRAWINGS

The exact nature of this invention as well as other objects and advantages thereof will be readily apparent from consideration of the following specification and drawings in which.

DESCRIPTION OF THE PREFERRED EMBODIMENT

Figure 1:
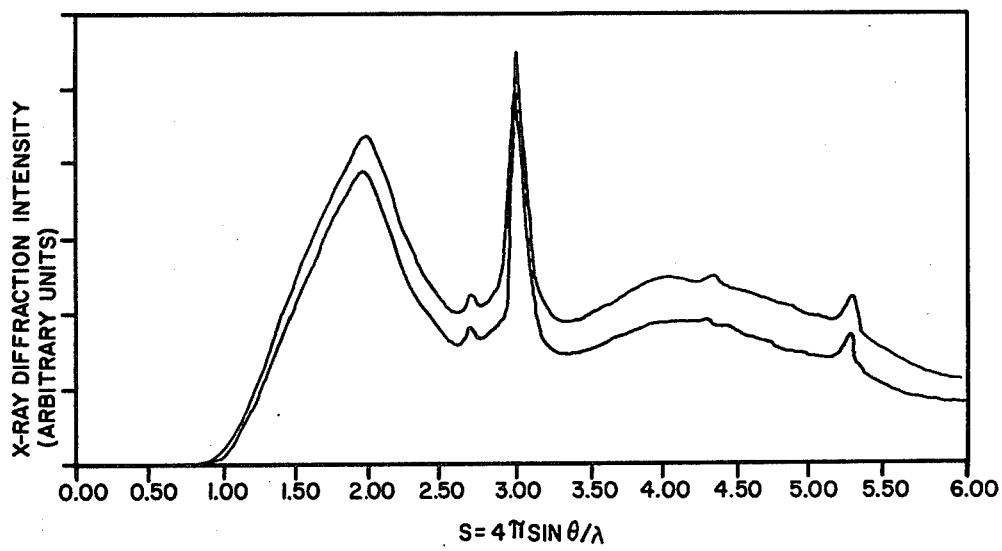
FIG. 1 is an X-ray intensity pattern for a 70,000 Å film of $Fe_{0.85}Bi_{0.15}$. The lower curve has been corrected for substrate contributions.

The alloys of the present invention may be represented by the general formula:

$$A_{1-x}D_x$$

where A and D are selected from the group consisting of metallic elements and metallic alloys, each elemental component of D has an atomic radius about 1.2-2.5 times and preferably about 1.2 to 1.5 times larger than the atomic radii of the elemental components of A, A and D are immiscible in each other, 0.1 x 0.4 and preferably 0.1 x 0.3. In this description, substances are immiscible if the solubility of one of the substances in the other is less than about 1 atomic percent.

To make the alloys of this invention, two immiscible metals, are chosen, each elemental component of one metal should have an atomic radius about 1.2-2.5 times and preferably about 1.2-1.5 times larger than the atomic radii of the elemental components of the other metal. In this description, and the claims that follow, "metal" refers to a metallic element or a stable metallic alloy. The metals are simultaneously vaporized into a vacuum (typically, about $10^{-10}$ to $10^{-8}$ Torr) and allowed to condense onto a suitable substrate. The substrate should be cool enough that both metals will solidify almost instantly upon condensation. To promote the rapid condensation and solidification of the metal vapors, for (Fe,Co)-Bi alloys the substrate is preferably at or below 100° C. This rapid condensation and solidification allows an amorphous, metastable alloy to form as a film upon the substrate. Presumably, the rapid solidification prevents the metals from segregating and crystallizing. The composition of the alloy is typically controlled by simultaneously vaporizing the two metals at different rates so that the alloy made contains about 10-30 atomic percent of the metal which has the components with the larger atomic radii, herein after referred to as the larger metal, as opposed to the other metal, hereinafter referred to as the smaller metal.

The metastable alloys of this invention appear to form only where the larger metal is the minority metal, constituting about 10-40 and preferably about 10-30 atomic percent of the alloy, and the smaller metal is the majority metal, constituting essentially the remainder. The novel metastable alloys are typically most stable when the larger metal is about 20 atomic percent of the alloy. That the stability region of these alloys is in about the same region as that for metallic glasses is quite surprising. Metallic glasses are amorphous alloys of a miscible metal and metalloid combination, for example $Fe_{0.8}B_{0.2}$. The stability region for metallic glasses is also about 20 atomic percent metalloid. However, in metallic glasses the majority atoms have much smaller atomic radii than the minority atoms. The best accepted theories to explain the stability of metallic glasses in this region are that the stability results from a deep eutectic, or that random packing of large and small hard spheres will form a somewhat stable amorphous structure when about 20 percent of the spheres are small. Nevertheless, neither of these theories could have predicted that two immiscible metals (for which no crystalline mixture can exist) could form a metastable alloy when about 10-40 percent of the alloy consists of the larger metal.

The preferred smaller metals are the transition elements, especially iron, cobalt, nickel, chromium, and copper. The preferred larger, or minority, metals are bismuth, lead, thallium and mercury. The most preferred minority metal is bismuth. The most preferred majority metals are iron and cobalt.

The alloys are preferably prepared by dual electron beam deposition onto a suitable substrate. The alloy composition can be monitored and controlled by using quartz crystal oscillator gauges for each element. The alloys could also be formed using other forms of vapor-deposition, for example, sputter deposition.

A wide variety of substrates may be employed in this process. Suitable substrates include, but are not limited to: cover glass slides; fuzed quartz; and plastics such as polyethylene. So long as the alloy film will form on the substrate, and the substrate is inert to the alloy, the substrate is suitable. If desired, the alloy may be scraped off the substrate and powdered.

Film thickness is best kept below 10,000 Å when a dual electron beam is employed at room temperature. Thicker films can, however, be made. These thicker films do not form as readily with a pure amorphous structure and the region of greatest stability is displaced to a higher concentration of the majority metal. Sputter deposition may make the preparation of thicker films somewhat easier and reduce the tendency toward a higher concentration of the majority metal.

Novel alloys of this invention having the formula $Co_{1-x}Bi_x$ or $Fe_{1-x}Bi_x$, where 0.1 x 0.3, have several useful properties. The alloys remain in the amorphous state with no apparent structural rearrangements at higher temperatures than many metallic glasses. Also, the alloys are highly resistant to oxidation and tarnishing at room temperature. Moreover, the alloys have good reflectivity and high bulk magnetization, indicating a high potential for large magnetic Kerr rotation in some wavelength regions. Thus the alloys have applications in such devices as magneto-optical mirrors. Other alloys of this invention having a ferromagnetic majority metal should also have useful magnetic properties.

While the magnetic and optical properties of the alloys of this invention depend strongly on the particular characteristics of the alloys constituent elements, the structural properties of the novel alloys, and their stability near $x=0.2$ is believed to derive mostly from the size ratio and immiscibility of the constituent elements.

Fe-Bi films of this invention have their moments oriented perpendicular to the film plane by a large uniaxial anisotropy ($K_u = -4 \times 10^5$ ergs/cm$^3$). This anisotropy should make the films excellent choices as ferromagnetic materials for perpendicular magnetic recording. Co-Bi alloys should have similar anisotropic properties. Doping or other means which reduce growth-induced anisotropy could be used to cause the magnetic domains to orient parallel to the film surface.

EXAMPLES

Having described the invention in general, the following examples are being given to illustrate the principles of the invention and are not intended to limit the scope of the invention in any manner. Several thin films (t<10,000 Å) of $(Fe,Co)_{1-x}Bi_x$ were synthesized near $x=0.2$. Above or below this composition (for 0.1 x 0.3) the x-ray patterns indicated a predominant amorphous alloy along with crystalline iron or cobalt and bismuth Bragg peaks which decreased in intensity as the concentration approached $x=0.2$. Films of $Mn_{0.8}Bi_{0.2}$ were prepared for comparison by the well known technique of Yoshida et al., published in J. Crys. Growth 45, 376 (1978), incorporated herein by reference. Those films, in agreement with earlier studies, were found to be amorphous.

Although crystalline Bragg reflections for the elemental metals were clearly distinguishable using such thin films, it was difficult to obtain quantitative information on the amorphous patterns because of substrate contributions. In an attempt to obtain this amorphous structure information, films of a thickness near 70,000 Å were made. These thicker films did not form as readily with a pure amorphous structure as the thin films, and the more stable amorphous composition range was displaced to a higher iron concentration. A typical x-ray pattern for these thicker films is shown in FIG. 1 for $x=0.15$. While the majority of the alloy was amorphous, trace amounts of crystalline iron were present as indicated by the peaks at $S=4\pi \sin \theta/\lambda$ values of 3.1 Å and 5.37 Å. Compared with alloys of only slightly higher bismuth concentrations, these crystalline peaks were quite weak. The absence of Bragg peaks for bismuth and the relatively weak iron peaks indicated that most of the material in this sample was amorphous. Because of its high atomic Z, bismuth has a large scattering factor and Bragg peaks for crystalline bismuth would have been quite intense, particularly at $S=1.92$ Å.

Figure 2:
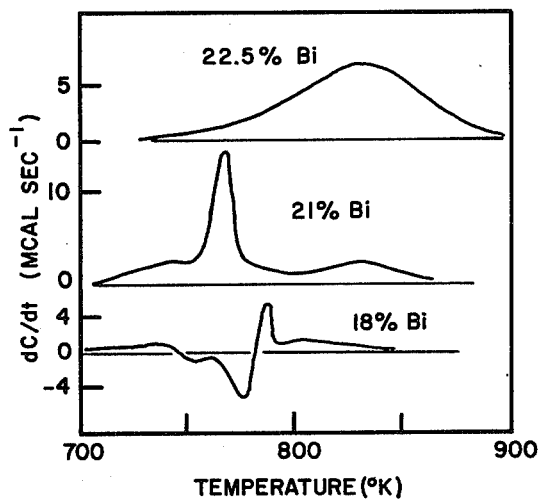
FIG. 2 shows differential scanning calorimetry curves for compositions of $Fe_{1-x}Bi_x$ having 22.5, 21, and 18 atomic percent of bismuth as labeled.

Typical DSC curves of three Fe-Bi alloys near $x=0.2$ are shown in FIG. 2. The general features observed included one or more exothermic transitions (presumably crystallization) sometimes accompanied by endothermic reactions. The highest observed crystallization temperature, $T_c$, was 835 K. at $x=0.225$ which was higher than for many of the metallic glasses. It seems plausible to associate the endothermic reactions with the formation or liquid bismuth. Although bismuth metal melts at 554 K. it is apparently constrained by the lattice and liquification cannot occur until a much higher temperature and atomic mobility is achieved.

Figure 3:
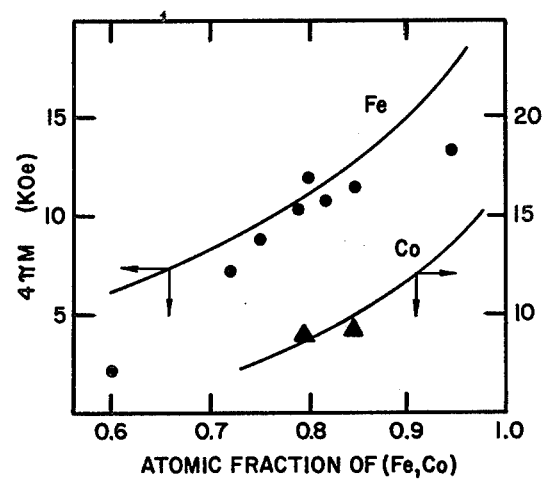
FIG. 3 is a graph of room temperature verses iron/cobalt content in $(Fe,Co)_{1-x}Bi_x$ alloys.

The amorphous films produced were ferromagnetic but measurements on $Mn_{0.8}Bi_{0.2}$ show no permanent moment down to 78 K. The magnetic properties of (Fe,Co)-bismuth alloys were considerably different from the Fe,Co metallic glasses. The magnitude of the atomic magnetic moments in metallic glasses was found to decrease continuously with increasing metalloid composition. As shown in FIG. 3, this did not occur in the (Fe,Co)-bismuth alloys. The upper and lower solid curves are calculations of alloy magnetization for Fe-Bi and Co-Bi respectively, assuming the full room temperature moment for iron or cobalt and a simple dilution with non-magnetic bismuth. Within the scatter of the data and near $x=0.2$, the iron moment appeared to be at least 95 percent of that for pure iron metal at $x=0.2$, although higher and lower bismuth substitution produced a deviation from the calculated curve. The alloys at 60 and 95 percent iron were highly crystalline and these data are shown only for comparison. Nevertheless, with different metal combinations or with a different means of vapor-deposition (e.g., sputter deposition) it could be possible to obtain a metastable amorphous alloy having a higher concentration of the minority metal, up to about 40 atomic percent.

Figure 4:
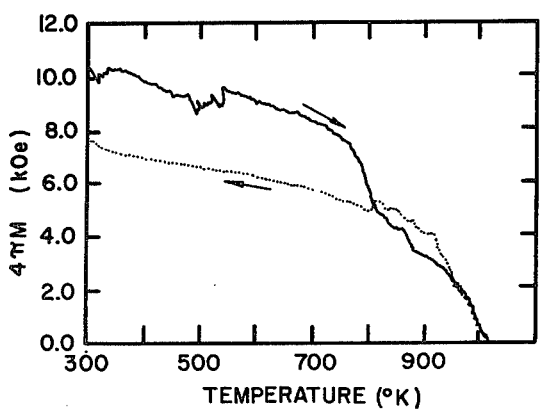
FIG. 4 is a graph of magnetization versus temperature for $Fe_{0.84}Bi_{0.16}$ for increasing (solid curve) and decreasing (dotted curve) temperatures.

In FIG. 4 M(T) is plotted for $Fe_{0.84}Bi_{0.16}$. Similar curves were obtained for higher bismuth concentrations, except that the features associated with the drop in magnetization near 800 K. were somewhat different. At first glance, the decrease of M(T) with increasing temperature would appear to have been much less rapid than for the metallic glasses. However, near 350 K. and 550 K. there were small irreversible, discontinuous increases of the alloy magnetization. Below 350 K., the decrease of M(T) with increasing temperature was similar to although not as rapid as that for metallic glasses. Above each successive discontinuity, M(T) decreased more gradually than before, up to about 800 K. where there was a drastic reduction in the magnetization. The small changes in M(T) at 350 K. and 550 K. may have arisen from minor structural relaxations which did not have suficient free energy changes to be observed in the DSC scans but which resulted in a higher Fe-Fe near-neighbor correlation with subsequent higher magnetization and stronger exchange coupling. The abrupt decrease in magnetization near 800 K. occured in the same temperature range where transitions were noted in the DSC scans. M(T) continued to decrease to the Curie temperature (1,020 K.) which was very near that of alpha iron (1,040 K.). When the temperature was then reduced slowly to room temperature, M(T) followed a relatively smooth curve with an extrapolated magnetization which was 30 percent below that of the original alloy. This behavior indicated that after heating to 1,000 K., a significant amount of the iron was contained in a crystallized or amorphous form which differed from iron metal and the initial amorphous structure.

Figure 5:
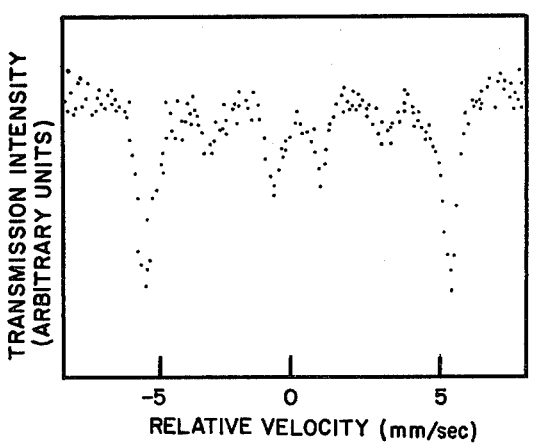
FIG. 5 is a Mössbauer spectrum of $Fe_{0.80}Bi_{0.20}$ with gamma-ray propagation perpendicular to the film plane.

The room temperature Mössbauer spectrum in FIG. 5 further confirmed the magnetization findings. The overall spectral splitting between lines one and six was 95 percent of that of iron metal. In addition, the lines were only 30 percent broader than for iron, which indicated that bismuth atoms did not affect nearest-neighbor iron moments as strongly as the metalloids do in the metallic glasses. The very weak intensities of lines two and five in FIG. 5 revealed that the Fe-Bi films had their moments oriented perpendicular to the film plane by a large uniaxial anisotropy. By combining FMR and magnetization data, a value for this anisotropy of $K = -4 \times 10^5$ ergs/cm was deduced.

The magnetic switching characteristics could be improved by varying the substrate temperature during deposition. A temperature of 75° C. was found to produce more nearly square switching characteristics and lower coercive fields (<100 Oe). Preliminary magneto-optic Kerr effect measurements were made at $\lambda = 0.63$ microns. These indicated a reduced Kerr rotation for $Fe_{1-x}Bi_x$ in proportion to the average alloy moment, whereas the rotation for $Co_{1-x}Bi_x$ was reduced by a much smaller amount.

Further details and discussion concerning this invention may be found in Forester et al, J. Appl. Phys., 53, 2240-42 (1982) incorporated herein by refrence.

Obviously many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A metastable, amorphous alloy consisting essentially of $A_{1-x}Bi_x$, where A is selected from the group consisting of iron and cobalt and 0.1 x 0.3.

2. A film comprising a metastable amorphous alloy upon a suitable substrate, said substrate consisting essentially of glass, fused quartz or polyethylene, and said alloy consisting essentially of $A_{1-x}Bi_x$, where A is selected from the group consisting of iron and cobalt and 0.1 x 0.3.

3. A metastable, amorphous alloy consisting essentially of $A_{l-x}D_x$ where A is a transition metal and D is selected from the group consisting of lead, bismuth, thallium, mercury and stable alloys thereof, each elemental component of D has an atomic radius 1.2-2.5 times larger than that of each elemental component of A, A and D are less than about 1 atomic percent soluble in each other, 0.1 x 0.4 and wherein A is selected from the group consisting of iron, cobalt and nickel.

4. The alloy of claim 3 wherein D is lead, bismuth, thallium or mercury.

5. The alloy of claim 4 wherein A is iron, cobalt, or nickel and D is lead or bismuth.

6. The alloy of claim 5 where D is bismuth.

7. A film comprising a metastable, amorphous alloy upon a substrate, said alloy consisting essentially of $A_{1-x}D_x$, where A is a transition metal and D is selected from a group consisting of lead, bismuth, thallium, mercury, and stable alloys thereof, each elemental component of D has an atomic radius 1.2-2.5 times larger than that of each elemental component of A, A and D are less than about 1 atomic percent soluble in each other, 0.1 x 0.4 and wherein A is selected from the group consisting of iron, cobalt and nickel.

8. The alloy of claim 7 wherein D is lead, bismuth, thallium or mercury.

9. The film of claim 8 where A is iron, cobalt or nickel, and D is lead or bismuth.

10. The film of claim 9 where D is bismuth.

11. The film of claim 10 wherein said substrate is selected from the group consisting of glass, fused quartz and polyethylene.

* * * * *